(12) United States Patent
Kim

(10) Patent No.: US 7,636,008 B2
(45) Date of Patent: Dec. 22, 2009

(54) PASS GATE CIRCUIT STABLY TRANSFERRING SIGNAL AND CONTROL METHOD

(75) Inventor: Jae-hoon Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 18 days.

(21) Appl. No.: 11/779,329

(22) Filed: Jul. 18, 2007

(65) Prior Publication Data
US 2008/0074160 A1 Mar. 27, 2008

(30) Foreign Application Priority Data
Sep. 22, 2006 (KR) .................. 10-2006-0092454

(51) Int. Cl.
H03K 17/687 (2006.01)
(52) U.S. Cl. .................. 327/427; 327/365; 327/419
(58) Field of Classification Search .................. 327/202
See application file for complete search history.

(56) References Cited

U.S. PATENT DOCUMENTS 5,939,915 A   8/1999   Curran

FOREIGN PATENT DOCUMENTS

| JP | 05252015 | 9/1993 |
| KR | 1020040055866 A | 6/2004 |
| KR | 1020050039245 A | 4/2005 |

*Primary Examiner*—Lincoln Donovan
*Assistant Examiner*—Daniel Rojas
(74) *Attorney, Agent, or Firm*—Volentine & Whitt, PLLC

(57) ABSTRACT

Provided are a pass gate circuit and a method of controlling the same for improving meta-stability when transferring signals. The gate circuit includes a signal transfer unit transferring an input signal in response to a transfer control signal, and a control signal generating unit generating a safety window having a predetermined width in response to detection of a transition of the input signal, generating an internal control signal for maintaining the signal transfer state of the signal transfer unit, and outputting the internal control signal to the signal transfer unit as the transfer control signal.

15 Claims, 5 Drawing Sheets

US 7,636,008 B2

PASS GATE CIRCUIT STABLY TRANSFERRING SIGNAL AND CONTROL METHOD

CROSS-REFERENCE TO RELATED PATENT APPLICATION

This application claims the benefit of Korean Patent Application No. 10-2006-0092454, filed on Sep. 22, 2006, the subject matter of which is hereby incorporated by reference.

BACKGROUND OF THE INVENTION

1. Field of the Invention

The present invention relates to a pass gate circuit and a method of controlling same. More particularly, the invention relates to a pass gate circuit and a related control method that provide improved meta-stability during signal transfer.

2. Description of the Related Art

So-called pass gate circuits are commonly used in the circuits forming semiconductor memory device. In this context, many pass gate circuits are used to facilitate switching operations. For example, a pass gate circuit may be used to implement a latched data output circuit in a semiconductor memory device. Pass gate circuits are turned ON/OFF in response to a control signal. When turned ON, a pass gate circuit will receive and output an input signal. When turned OFF, the output of the received input signal by the pass gate circuit is disabled.

Figure (FIG.) 1 is a circuit diagram of a conventional pass gate circuit 10. Referring to FIG. 1, pass gate circuit 10 includes a transfer controller 11 and a latch 12. Transfer controller 11 includes a pass gate PG implemented with a Complementary Metal Oxide Semiconductor (CMOS) element configured with at least one inverter. Latch 12 includes at least one inverter to latch a received signal until it is output. An initial input signal "A" is the input signal to be transferred through pass gate circuit 10. An external control signal "B" is applied as a control signal to the control electrode of pass gate PG. Thus, control signal B controls the transfer of input signal A through pass gate circuit 10. Furthermore, signal C is the output signal of pass gate circuit 10.

Unfortunately, conventional pass gate circuit 10 can operate in an unstable mode when input signal A and control signal B simultaneously transition from one logic level to another. During unstable operation, the output signal from pass gate circuit 10 becomes unstable such that its amplitude decreases to thereby cause a meta-stability problem.

FIG. 2 is a waveform diagram illustrating an unstable signal transfer by pass gate circuit 10. Referring to FIG. 2, input signal A and control signal B simultaneously transition from a logically high level (hereafter "high") to a logically low level (hereafter "low"). When control signal B transitions to low, the pass gate PG is turned OFF and current cannot be supplied to the input terminal of pass gate circuit 10, and the output of the pass gate PG becomes unstable.

Output signal C from pass gate circuit 10 varies in relation to input signal A. Pass gate circuit 10 operates normally when input signal A transitions outside the period when control signal B transitions. However, when input signal A and control signal B transition simultaneously, output signal C follows input signal A after a predetermined delay time. As a result, and as illustrated in FIG. 2, a completely different output signal waveform is obtained over that which is intended under normal operation of pass gate circuit 10.

SUMMARY OF THE INVENTION

Embodiments of the invention provide a pass gate circuit and a method of controlling same that provide a stable output signal even under conditions wherein applied input and control signals simultaneously transition.

In one embodiment, the invention provides a pass gate circuit comprising; a signal transfer unit transferring an input signal in response to a transfer control signal, and a control signal generating unit generating a safety window having a predetermined width in response to detection of a transition of the input signal, generating an internal control signal for maintaining the signal transfer state of the signal transfer unit, and outputting the internal control signal to the signal transfer unit as the transfer control signal.

In another embodiment, the invention provides a semiconductor memory device comprising a pass gate circuit transferring an input signal, wherein the pass gate circuit comprises; a signal transfer unit transferring an input signal in response to a transfer control signal, and a control signal generating unit generating a safety window having a predetermined width in response to detection of a transition of the input signal, generating an internal control signal for maintaining the signal transfer state of the signal transfer unit, and outputting the internal control signal to the signal transfer unit as the transfer control signal.

In another embodiment, the invention provides a method of driving a pass gate circuit comprising; sensing transition of an input signal, generating a safety window having a predetermined width defined in response to detection of a transition of the input signal, generating an internal control signal for maintaining a signal transfer state applied to a transfer gate transferring the input signal during the period of the safety window, and outputting the internal control signal to the transfer gate.

DESCRIPTION OF EMBODIMENTS

Figure 1:
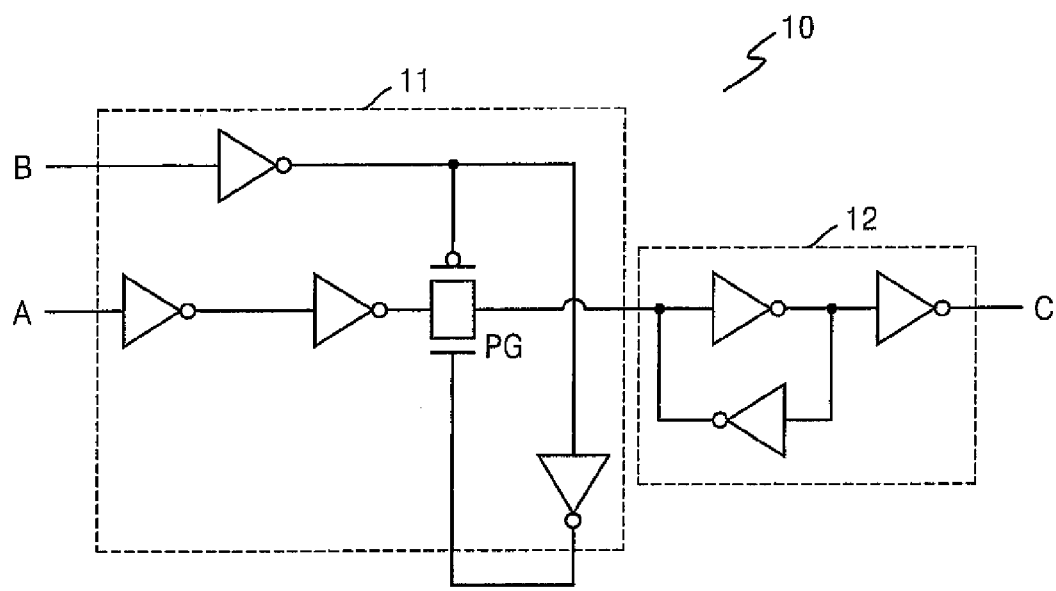
FIG. 1 is a circuit diagram of a conventional pass gate circuit.
Figure 2:
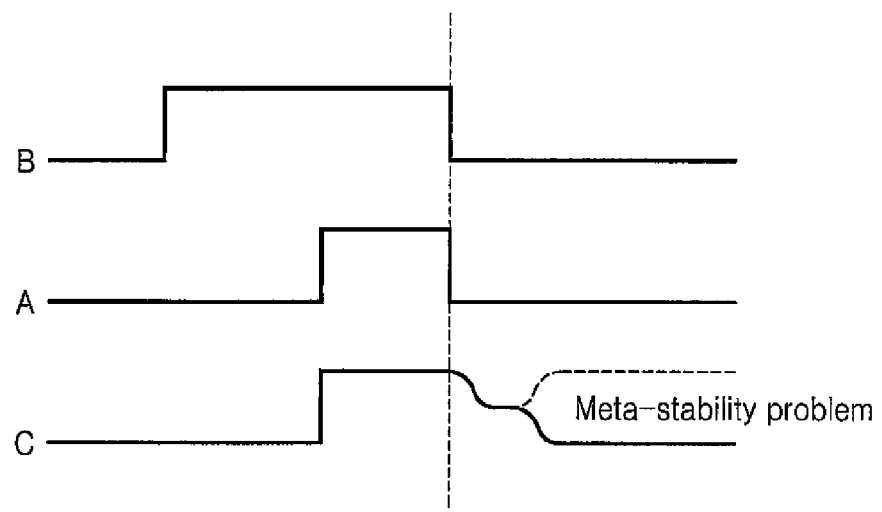
FIG. 2 is a timing diagram illustrating unstable signal transfer of the pass gate circuit illustrated in FIG. 1.

The present invention will now be described more fully with reference to the accompanying drawings in which embodiments of the invention are shown. The invention may, however, be embodied in many different forms and should not be construed as being limited to only the illustrated embodiments. Rather, these embodiments are presented as teaching examples. Throughout the written description and drawings, like reference numerals refer to like or similar elements.

Figure 3:
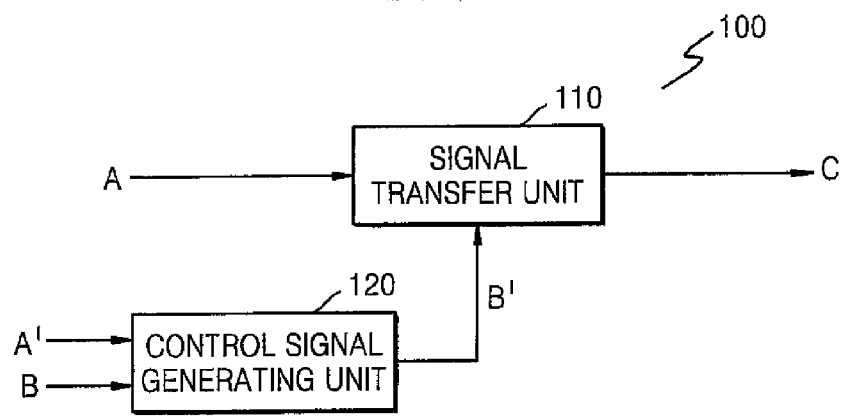
FIG. 3 is a block diagram of a pass gate circuit according to an embodiment of the present invention.

FIG. 3 is a block diagram of a pass gate circuit 100 according to an embodiment of the invention. Referring to FIG. 3, pass gate circuit 100 includes a signal transfer unit 110 and a control signal generating unit 120.

Signal transfer unit 110 transfers an input signal A in response to a predetermined control signal and provides a corresponding output signal C. Control signal generating unit 120 receives an external control signal B, generates an internal control signal B' in response to an initial input signal A' and external control signal B, and outputs the internal control signal B' to signal transfer unit 110.

The embodiment of the invention illustrated in FIG. 3 essentially prevents a signal controlling the constituent transfer gate of signal transfer unit 110 and input signal A from transitioning simultaneously. That is, the illustrated embodiment derives internal control signal B' from external control signal B and uses internal control signal B' to control the transfer gate.

Figure 6:
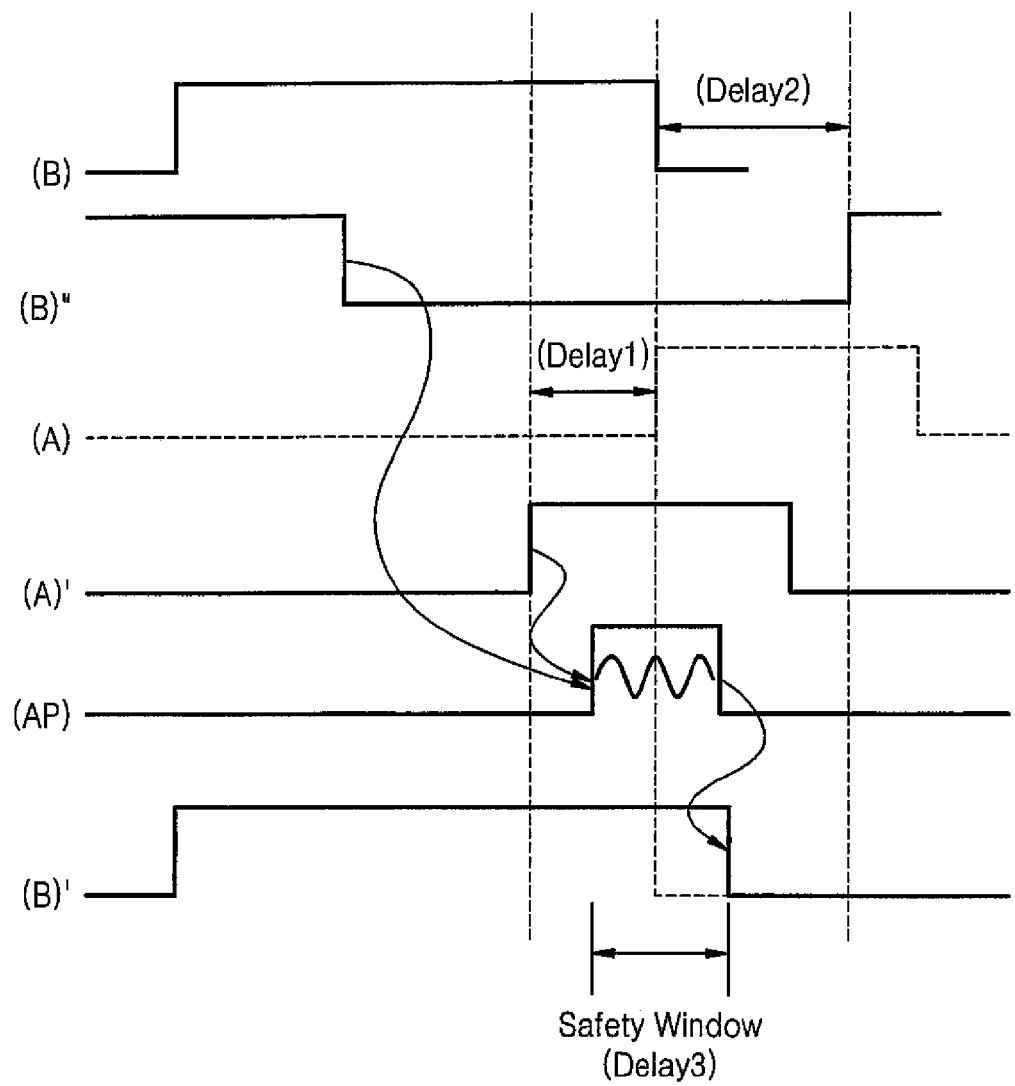
FIG. 6 is a waveform diagram of signals illustrated in FIGS. 5A through 5E.

Control signal generating unit 120 senses a transition of input signal A and provides a safety window having a predetermined width responsive to the sensed transition, wherein the predetermined width corresponds to a defined delay, (see, e.g., delay 3 conceptually illustrated in FIG. 6). When sensing the transition of input signal A, control signal generating unit 120 uses a signal having a lagging phase relative to input signal A. Of note, the conventional pass gate circuit often generates input signal A using a delay process applied to an initial input signal A'. In other words, the initial input signal A' is normally present in the context of a semiconductor memory device incorporating a pass gate circuit. Thus, when the initial input signal A' is subjected to the delay process in order to become input signal A, the transition timing of input signal A may be sensed prior to its actual occurrence.

Accordingly, control signal generating unit 120 is able to generate the safety window in relation to an auto pulse derived from the sensed transition of the initial input signal A'. Furthermore, the width of the safety window may be controlled by adjusting the width of the auto pulse. It is preferable that the width of the safety window be controlled such that the width of the safety window includes the transition point of input signal A.

Control signal generating unit 120 generates internal control signal B' in relation to external control signal B and the defined safety window. The internal control signal B' may be generated by performing a logic operation on external control signal B within the safety window. Internal control signal B' has a waveform that maintains a defined logic level during the entire period of the safety window. That is, the width of the safety window should include the transition point of input signal A, and by so doing, internal control signal B' is able to maintain its logic level before and after the transition point of input signal A.

Control signal generating unit 120 outputs internal control signal B' to signal transfer unit 110. Internal control signal B' maintains its logic state during the signal transfer period to signal transfer unit 110 as defined by the safety window period. That is, internal control signal B' will not transition during the safety window, and thus it is possible to prevent input signal A and the signal controlling the transfer gate from transitioning simultaneously.

An exemplary operation of control signal generating unit 120 will now be explained in some additional details with reference to FIG. 4.

Figure 4:
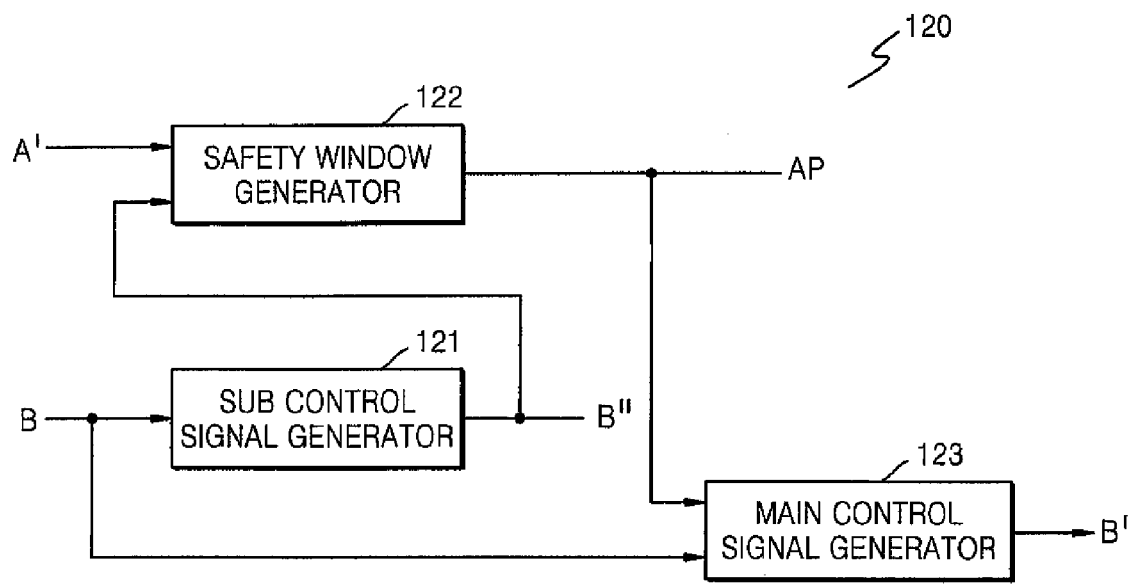
FIG. 4 is a block diagram of a control signal generating unit illustrated in FIG. 3.

FIG. 4 is a block diagram of control signal generating unit 120 illustrated in FIG. 3. Referring to FIG. 4, control signal generating unit 120 includes a sub control signal generator 121, a safety window generator 122 and an internal control signal generator 123. Sub control signal generator 121 generates a sub control signal B" in relation to external control signal B. The sub control signal B" may be generated by inverting and delaying the external control signal B. The inverted external control signal B (bar) may be delayed by a sufficient period to allow sub control signal B" to be enabled outside the safety window.

Safety window generator 122 generates a safety window signal (AP) in relation to initial input signal A'. For example, safety window generator 122 may be implemented using an auto pulse generator (not shown) that generates the safety window having a predetermined width in relation to the sensed transition of initial input signal A'. The initial input signal A' has a leading phase in relation to the phase of input signal A, and the safety window AP includes a transition point of the input signal A.

The width of the safety window as defined by the safety window signal AP may be controlled by the amount of delay applied by a delay element within an auto pulse generator, for example. In one embodiment of the invention, the applied delay controlling the width of the safety window is controlled in relation to the phase difference between the input signal A and the initial input signal A'.

The sub control signal B" generated by sub control signal generator 121 is provided to safety window generator 122. As described above, sub control signal B" may be generated by delaying external control signal B.

In one embodiment, sub control signal B" is enabled outside of the safety window, such that sub control signal B" is applied to safety window generator 122 to prevent the safety window from being enabled. That is, sub control signal B" is enabled to block enablement of the safety window, irrespective of a transition in input signal A. After internal control signal B' is disabled, input signal A must not be transferred when input signal A transitions. However, if the safety window is enabled in response to a transition in input signal A, internal control signal B' may be enabled during a period when internal control signal B' is disabled. Sub control signal B" prevents this from happening. That is, sub control signal B" is enabled to forcibly prevent the safety window from being enabled.

Main control signal generator 123 generates internal control signal B' in relation to external control signal B and safety window AP. Internal control signal B' is enabled during a period wherein both external control signal B and safety window are enabled.

Accordingly, the internal control signal B' maintains its logic level during the period of the safety window which is different from external control signal B. For example, internal control signal B' maintains an enabled state while the safety window AP is enabled. Accordingly, even when input signal A transitions during the enabled period of the safety window AP, internal control signal B' maintains its enabled state to prevent input signal A and the signal controlling the transfer gate within signal transfer unit 110 from transitioning simultaneously.

Figure 5A:
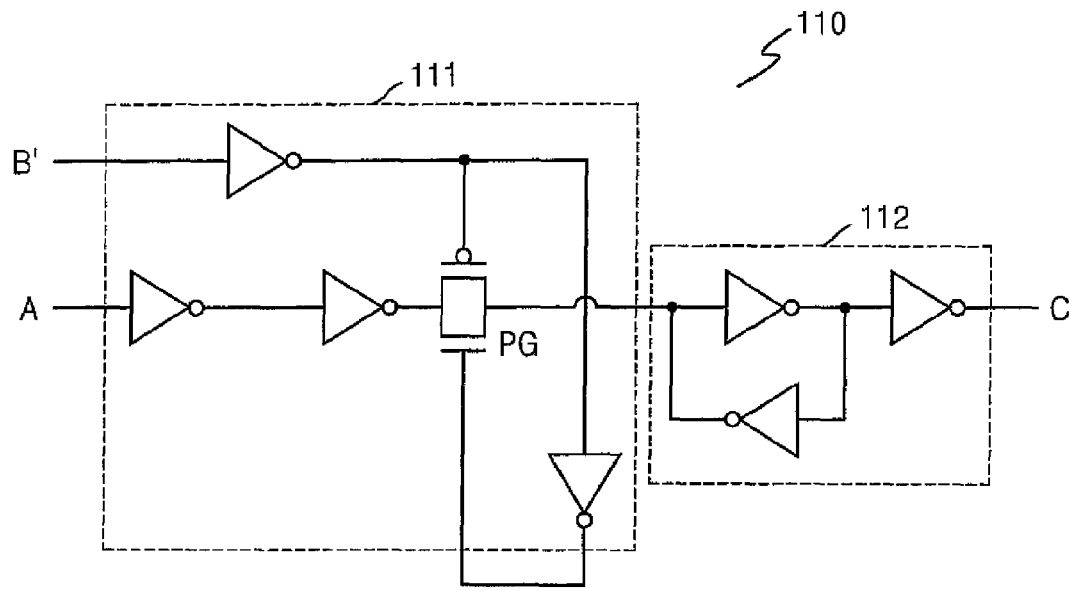
FIG. 5A is a circuit diagram of a signal transfer unit illustrated in FIG. 3.

A pass gate circuit according to another embodiment of the present invention will now be explained in some additional detail with reference to FIGS. 5A through 5E. FIG. 5A is a circuit diagram of signal transfer unit 110 illustrated in FIG.

Figure 5B:
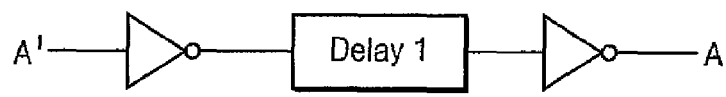
FIG. 5B is a circuit diagram illustrating a phase difference between an input signal and an initial input signal in the pass gate circuit according to an embodiment of the present invention.
Figure 5C:
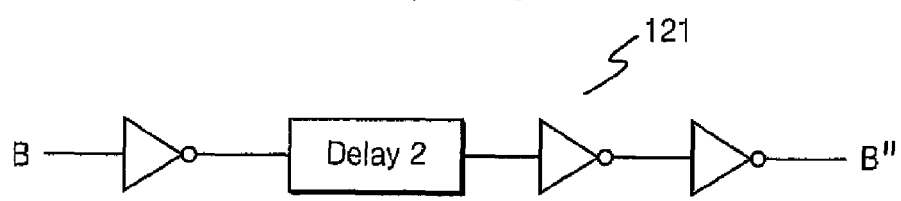
FIG. 5C is a circuit diagram of a sub control signal generator illustrated in FIG. 4.
Figure 5D:
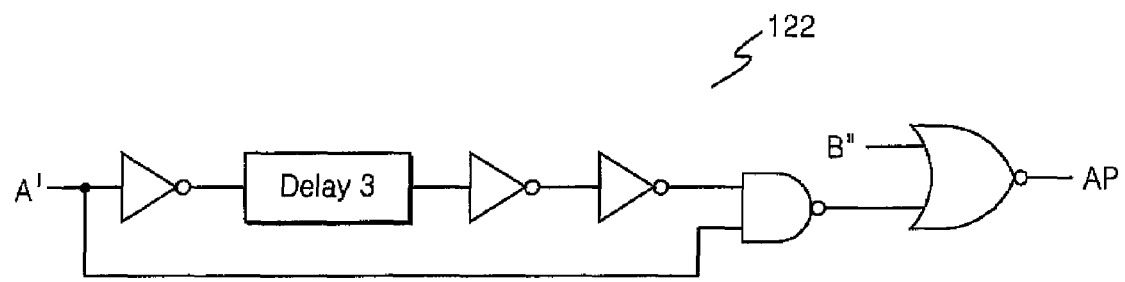
FIG. 5D is a circuit diagram of a safety window generator illustrated in FIG. 4.
Figure 5E:
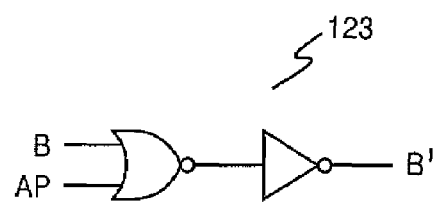
FIG. 5E is a circuit diagram of an internal control signal generator illustrated in FIG. 4.

3. FIG. 5B is a circuit diagram illustrating a phase difference between input signal A and initial input signal A'. FIG. 5C is a circuit diagram of sub control signal generator 121 in FIG. 4. FIG. 5D is a circuit diagram of safety window generator 122 in FIG. 4. FIG. 5E is a circuit diagram of main control signal generator 123 illustrated in FIG. 4.

Referring to FIG. 5A, signal transfer unit 110 includes a transfer controller 111 and a latch 112. Transfer controller 111 includes a CMOS pass gate PG including at least one inverter. Latch 112 includes at least one inverter for latching and outputting an applied input signal.

Internal control signal B' is applied to a control electrode of the pass gate PG included in transfer controller 111. Input signal A is transferred when the signal transfer state of the pass gate PG is turned ON and the transfer of the input signal A is interrupted when the signal transfer state of the pass gate PG is OFF. The transferred input signal A passes through latch 112 and is provided to an external device. The signal C is the output signal of signal transfer unit 110.

FIG. 5B illustrates one approach to generating input signal A from initial input signal A', as used to generate the safety window. As described above, initial input signal A' is subjected to a predetermined delay to generate input signal A. The phase difference between input signal A and initial input signal A' corresponds to a first delay (DELAY1).

Referring to FIG. 5C, sub control signal generator 121 includes a delay element and at least one inverter. Sub control signal generator 121 delays and inverts external control signal B to generate sub control signal B".

As described above, sub control signal B" is provided to safety window generator 122 to prevent the safety window from being enabled. A second delay (DELAY2) provided by the delay element in sub control signal generator 121 should be sufficiently large, such that sub control signal B" is enabled outside the safety window.

Referring to FIG. 5D, safety window generator 122 includes at least one inverter, a delay element, a NAND gate and a NOR gate. Safety window generator 122 generates an auto pulse in response to initial input signal A'. Sub control signal B" is applied to an input terminal of the NOR gate. Initial input signal A' is applied to one terminal of the NAND gate. A signal obtained by delaying initial input signal A' by a third delay (DELAY3) and inverting the delayed signal is applied to the other terminal of the NAND gate. The width of the safety window may be controlled by selection of the third delay (DELAY3).

The output signal of the NAND gate and sub control signal B" are applied to terminals of the NOR gate. The output signal from the NOR gate is applied to main control signal generator 123 in relation to the safety window. When sub control signal B" is enabled, and thus a high-level signal is applied to the input terminal of the NOR gate, the NOR gate disables the safety window irrespective of the generation of the auto pulse using initial input signal A'.

Referring to FIG. 5E, main control signal generator 123 includes a NOR gate having a first input terminal receiving external control signal B and a second input terminal receiving the safety window signal AP. The output of the NOR gate is applied to an inverter. Since external control signal B and safety window signal AP are applied to the NOR gate, internal control signal B' as generated by the main control signal generator 123 is enabled during a period in which external control signal B and safety window signal AP are both enabled.

An exemplary operation of the pass gate circuit according to the foregoing embodiments of the invention will now be explained with reference to signal waveforms illustrated in FIG. 6.

Referring to FIG. 6, input signal A and initial input signal A' are characterized by a phase difference (initial input signal A' leading input signal A) corresponding to the first delay (DELAY1). Accordingly, initial input signal A' transitions before input signal A, and the safety window is defined with a predetermined width as generated by the transition of initial input signal A'. The width of the safety window may be controlled in accordance with the third delay DELAY3, as described above.

As illustrated in FIG. 6, the safety window signal AP may be enabled following a predetermined delay from a transition of initial input signal A'. The waveform shown in the illustrated example, per the period of the safety window signal AP, may be altered by adding additional delay element(s) to the circuit of FIG. 5D.

It is assumed that external control signal B transitions with input signal A, but the safety window as defined by safety window signal AP includes the transition of input signal A. Internal control signal B' is enabled during the enabled period of both external control signal B and safety window signal AP. Thus, internal control signal B' maintains its level before and after the transition point of input signal A.

Internal control signal B' is transferred to the transfer gate PG illustrated in FIG. 5A and controls operation of the transfer gate PG. Thus, the transfer gate PG maintains an ON state even when external control signal B turns the transfer gate PG OFF. Accordingly, the transfer gate PG is prevented from being turned OFF at the same time that input signal A transitions, thereby improving meta-stability of the circuit.

Sub control signal B" may be generated by delaying external control signal B by a sufficiently large time to ensure that sub control signal B" is enabled after internal control signal B' is disabled. When sub control signal B" is enabled, the safety window signal AP is disabled even when input signal A transitions. Accordingly, it is possible to prevent input signal A from being transferred through the transfer gate PG after internal control signal B' is disabled.

As described above, the present invention can prevent the signal controlling the transfer gate of a pass gate circuit and the input signal from transitioning simultaneously. Accordingly, signal transfer through the pass gate circuit is stably performed.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A pass gate circuit receiving an initial input signal and an external control signal, and comprising:
   a signal transfer unit transferring an input signal in response to an internal control signal, wherein the initial input signal has a leading phase with respect to the input signal; and
   a control signal generating unit comprising:
   a sub control signal generator delaying the external control signal to generate a sub control signal;
   a safety window generator generating a safety window signal in response to the sub control signal and the initial input signal, and a main control signal generator generating the internal control signal in response to the external control signal and the safety window signal;

wherein the pass gate circuit generates a safety window having a predetermined period width defined by a delay following detection of a transition of the initial input signal, such that the safety window is an auto pulse generated in relation to an initial input signal and is generated before a transition of the input signal.

2. The pass gate circuit of claim 1, wherein the period width of the safety window includes the transition of the input signal.

3. The pass gate circuit of claim 2, wherein the internal control signal maintains its level before and after the transition of the input signal.

4. The pass gate circuit of claim 1, wherein the sub control signal generator inverts and delays the external control signal.

5. The pass gate circuit of claim 4, wherein the safety window generator disables the safety window signal during a disabled period of the internal control signal irrespective of transition in the input signal when the sub control signal is enabled.

6. The pass gate circuit of claim 1, wherein the period width of the safety window is controlled by the delay as provided by a delay element within the safety window generator.

7. The pass gate circuit of claim 1, wherein the internal control signal is enabled during a period defined between a transition in the external control signal and an end of the safety window.

8. A semiconductor memory device comprising a pass gate circuit receiving an initial input signal and an external control signal, wherein the pass gate circuit comprises:

a signal transfer unit transferring an input signal in response to an internal control signal, wherein the initial input signal has a leading phase with respect to the input signal; and a control signal generating unit comprising:
a sub control signal generator delaying the external control signal to generate a sub control signal;
a safety window generator generating a safety window signal in response to the sub control signal and the initial input signal, and
a main control signal generator generating the internal control signal in response to the external control signal and the safety window signal;

wherein the pass gate circuit generates a safety window having a predetermined period width defined by a delay following detection of a transition of the initial input signal, such that the safety window is an auto pulse generated in relation to an initial input signal and is generated before a transition of the input signal.

9. The semiconductor memory device of claim 8, wherein the period width of the safety window includes the transition of the input signal.

10. A method of controlling the operation of a pass gate circuit receiving an initial input signal and an external control signal, the method comprising:

delaying the external control signal to generate a sub control signal;

generating a safety window signal in response to the sub control signal and following a transition of the initial input signal;

generating an internal control signal having an active period extending between a transition of the external control signal and an end of a safety window having a period width; and applying the internal control signal to a signal transfer unit within the pass gate circuit to transfer an input signal derived from the initial input signal, wherein the initial input signal has a leading phase with respect to the input signal, wherein the period width of the safety window begins in response to the safety window signal and before a transition of the input signal.

11. The method of claim 10, wherein the period width of the safety window includes the transition of the input signal.

12. The method of claim 10, further comprising disabling the safety window during a disabled period of the internal control signal irrespective of transition in the input signal.

13. The pass gate circuit of claim 1, wherein transition of the external control signal and transition of the input signal are coincident.

14. The semiconductor memory device of claim 8, wherein transition of the external control signal and transition of the input signal are coincident.

15. The method of claim 10, wherein transition of the external control signal and transition of the input signal are coincident.

* * * * *